United States Patent [19]
Byatt

[11] 4,375,125
[45] Mar. 1, 1983

[54] METHOD OF PASSIVATING PN-JUNCTION IN A SEMICONDUCTOR DEVICE

[75] Inventor: Stephen W. Byatt, Manchester, England

[73] Assignee: U.S. Philips Corporation, New York, N.Y.

[21] Appl. No.: 241,306

[22] Filed: Mar. 6, 1981

[30] Foreign Application Priority Data

Mar. 7, 1980 [GB] United Kingdom ............ 8007853

[51] Int. Cl.³ .................. H01L 21/205; H01L 29/34
[52] U.S. Cl. ............................ 29/588; 148/1.5; 148/187; 357/52; 357/54; 357/59; 427/86; 427/94; 29/571
[58] Field of Search ............. 148/1.5, 187; 29/588, 29/571; 427/86, 93, 94; 357/52, 54, 59

[56] References Cited

U.S. PATENT DOCUMENTS

| | | | |
|---|---|---|---|
| 3,391,287 | 7/1968 | Kao | 307/302 |
| 3,943,621 | 3/1976 | Hartman | 29/578 |
| 4,056,415 | 11/1977 | Cook et al. | 148/187 |
| 4,060,827 | 11/1977 | Ono et al. | 354/54 |
| 4,063,275 | 12/1977 | Matsushita et al. | 354/54 |
| 4,086,613 | 4/1978 | Biet et al. | 354/54 |
| 4,086,614 | 4/1978 | Scheidel | 354/54 |
| 4,194,934 | 3/1980 | Blaske et al. | 148/174 |
| 4,202,916 | 5/1980 | Chadda | 427/82 |

FOREIGN PATENT DOCUMENTS

| | | |
|---|---|---|
| 300472 | 4/1968 | Sweden . |
| 1294184 | 10/1972 | United Kingdom . |
| 1314267 | 4/1973 | United Kingdom . |
| 1496814 | 1/1978 | United Kingdom . |
| 1499845 | 2/1978 | United Kingdom . |
| 1536545 | 12/1978 | United Kingdom . |
| 1536764 | 12/1978 | United Kingdom . |

OTHER PUBLICATIONS

Matsushita et al., IEEE-Trans. Electron Devices, ED-23, (1976), 826.
Smeets et al., J. Electrochem. Soc., 124, (1977), 1458.

Primary Examiner—Upendra Roy
Attorney, Agent, or Firm—Paul R. Miller

[57] ABSTRACT

The surface termination of a p-n junction of a semiconductor device is passivated with semi-insulating material which is deposited on a thin layer of insulating material formed at the bared semiconductor surface by a chemical conversion treatment at a temperature above room temperature. The layer may be formed by oxidizing the semiconductor material of the body for example in dry oxygen between 300° C. and 500° C. or in an oxidizing liquid containing for example hydrogen peroxide or nitric acid at for example 80° C. The layer is sufficiently thin to permit conduction (e.g. by tunnelling) between the semi-insulating material and the surface but thick enough to reduce said conduction so that when the junction is reverse-biased leakage current flows further along the semi-insulating material before flowing out to the surface across the layer. This increases the spread of the junction depletion layer along the surface thereby permitting a high breakdown voltage even with a high resistivity for the material. The thin layer can also act as a barrier against gettering of lifetime-killers (e.g. gold) from the semiconductor body by the semi-insulating material. The semi-insulating material may be based on amorphous or polycrystalline silicon or a chalcogenide.

9 Claims, 8 Drawing Figures

METHOD OF PASSIVATING PN-JUNCTION IN A SEMICONDUCTOR DEVICE

This invention relates to methods of manufacturing a semiconductor device having a p-n junction terminating at a surface of the semiconductor body and being reversely biased in at least one operating condition of the device, in which, at least at the area where the p-n junction terminates at the surface, the surface is exposed and is provided with a passivating layer of semi-insulating material.

DESCRIPTION OF THE PRIOR ART

The article entitled "Highly reliable High-Voltage Transistors by use of the SIPOS process" by Matsushita et al in I.E.E.E. Transactions on Electron Devices, Vol. ED-23, No. 8, August 1976, pages 826 to 830 discloses such a method.

As discussed in this article significant advantages can be achieved when the semiconductor device surface is passivated with a semi-insulating layer rather than with an insulating layer such as silicon dioxide. In the method disclosed, the body is of silicon and the semi-insulating material is oxygen-doped polycrystalline silicon which is deposited directly on the silicon body surface. Before the semi-insulating layer is deposited the surface at which the p-n junction terminates is bared by etching away the silicon dioxide layer which was used during earlier manufacturing steps, for example to localize a p-type dopant diffusion treatment for forming the p-n junction of the desired planar-type devices. Furthermore the article teaches that natural oxide layers at the semiconductor body surface must be etched away before depositing the semi-insulating layer so as to avoid possible hot charge-carrier injection and trapping effects (so-called "memory" effects) which can modulate conductivity at the semiconductor surface and which are therefore considered undesirable for the passivation of a p-n junction termination.

When a p-n junction directly passivated with such a semi-insulating layer is reverse-biased, the reverse leakage current includes a current which flows through the semi-insulating layer between the p-type and n-type regions forming the p-n junction. In so far as this current flows along the layer it results in a potential drop along the semi-insulating layer. As a result of this potential drop a proportion of the negative potential of the p-type region is transmitted to the n-type region and so the depletion layer associated with the reverse-biased junction tends to spread along the surface. This modulates and relaxes the surface electric field around the junction and so can increase the breakdown voltage of a device if it is limited by surface breakdown. In order to reduce the leakage current it is desirable to increase the resistivity of the semi-insulating layer. However, an increase in this resistivity can result in a reduced increase in the spread of the depletion layer and so a reduced increase in breakdown voltage.

Furthermore in order to increase the switching speed of some devices it is sometimes desirable to incorporate lifetime-killer centers such as gold into the semiconductor body in order to reduce the lifetime of minority carriers. When the body surface is directly passivated with such a semi-insulating layer, it has been concluded that this layer can act as a getter which extracts a significant proportion of the gold from the semiconductor body.

SUMMARY OF THE INVENTION

It is the object of the invention to provide a semiconductor device of the above-mentioned kind having a breakdown voltage which is as high as possible and a leakage current which is as low as possible, in which the passivating layer influences the presence of the lifetime-killer centers as little as possible.

It is based on the recognition of the fact that this can be achieved by the controlled provision of an additional thin layer of insulating material.

For that purpose a method according to the invention is characterized in that before the semi-insulating material is provided, a conversion treatment is carried out at a temperature above room temperature, in which at the area of the exposed surface the material of the semiconductor body is chemically converted into a layer of insulating material on which the semi-insulating material is provided, the conversion treatment being continued until the layer has a thickness which is small enough to enable conduction between the passivating layer and the semiconductor body and which is large enough to keep the conduction so low that the width of the depletion layer associated with the reversely-biased p-n junction increases along the surface.

Contrary to previous teaching on using semi-insulating material for p-n junction passivation, a thin layer of insulating material is deliberately introduced into the device structure manufactured in accordance with the invention, between the semi-insulating layer and the semiconductor surface at which the p-n junction terminates. Because its thickness is such as to reduce but not eliminate conduction between the passivating layer and the semiconductor body this interface layer of insulating material appears to perform a barrier function which for a given resistivity of the semi-insulating layer encourages more of the leakage current in the semi-insulating layer to flow further along the layer before flowing across this barrier layer of insulating material to the semiconductor surface. As a result the potential difference applied to reverse bias the junction is dropped over a greater length of the semi-insulating layer so that for a given resistivity of the semi-insulating layer there is an increase in the spread of the depletion layer along the surface as compared with known device structures in which the semiconductor surface is directly passivated by semi-insulating material. This can increase the breakdown voltage of the reverse-biased junction, even when quite a high resistivity layer is used in order to reduce the magnitude of the leakage current.

Furthermore such an interface layer of insulating material of this thickness also appears to perform a barrier function in significantly reducing the gettering effect of the semi-insulating layer for charge-carrier lifetime-killers such as gold which may be required in the semiconductor body.

It has been found that in semiconductor devices manufactured according to the invention these advantages concerning breakdown voltage, resistivity of the semi-insulating layer and lifetime-killer can be obtained while retaining other, known advantages of semi-insulating material passivation, for example the reduction of undesirable charge effects at the semiconductor surface.

It will be evident that the quality and thickness of the layer of insulating material are important in obtaining the desired barrier functions. These properties of the layer can be controlled satisfactorily by forming the layer from the semiconductor body material by a chemical conversion treatment in a controlled environment and using a body surface temperature above room temperature. The elevated body surface temperature is important in providing a comparatively quick as well as easily controlled process for producing the layer.

In U.K. Pat. No. (GB) 1,536,764, it is stated that when passivating a semiconductor surface with a semi-insulating layer (which in this case contains both deep donor and deep acceptor levels) it is not always necessary before depositing the semi-insulating layer to bare the silicon surface completely by removing a thin insulating layer (usually oxide) formed naturally on the silicon. This natural layer is formed at room temperature and its thickness depends on ambient conditions such as the humidity and air temperature in the room. Its thickness can vary considerably with variations in the weather and also in atmospheric pollution.

So far as the present invention is concerned, it has been found necessary for obtaining a desired increase in breakdown voltage in a reliable manufacturing process always to remove such naturally-formed layers so that it is a bared surface which is subjected to the chemical conversion treatment at a temperature above room temperature to form the insulating layer having the desired properties. Therefore throughout the present Specification and particularly in the claims, the step of baring the semiconductor surface in a method in accordance with the present invention is to be understood as including the removal of any insulating layer which may have been formed naturally at the surface during the handling or storage of the semiconductor body and which is therefore not a layer deliberately formed by subjecting the body to a chemical conversion treatment at a temperature above room temperature.

A layer of insulating material formed at the surface of a semiconductor body from the semiconductor material of the body by a conversion treatment is known in the semiconductor device art by the expression "generic layer". The layer of insulating material formed in accordance with the present invention will generally be at least 10 A thick, but less than 100 A ($10^{-2}$ microns) thick. There are several known types of conversion treatment which may be used to form such thin generic layers at temperature above room temperature, especially using oxidation. The treatment may be performed both completely separate from the other steps in the method and it may be connected with one of them. Thus for example after mounting the semiconductor body in a reactor for the deposition of the semi-insulating material, an oxidizing gas stream may initially be fed through to form the generic layer (in this case an oxide layer) on the heated body before introducing other gases for the deposition of the semi-insulating material. The generic layer may also be formed in a simple manner when, as part of the treatment for baring the semiconductor surface the surface is exposed to a cleaning liquid at a temperature above room temperature such as for example nitric acid or a solution containing hydrogen peroxide both of which effect an oxidation treatment. However a separate oxidation treatment may be used which involves subjecting the bared semiconductor surface to dry oxygen and at an elevated temperature below 500° C.; the quality and thickness of the generic oxide layer so formed can be accurately controlled by controlling the oxygen pressure, and oxidation temperature and time.

BRIEF DESCRIPTION OF THE DRAWINGS

These and other features in accordance with the invention will now be described with reference to the accompanying diagrammatic drawings, illustrating by way of example various embodiments of the present invention. In these drawings.

DESCRIPTION OF THE PREFERRED EMBODIMENTS

Figure 1:
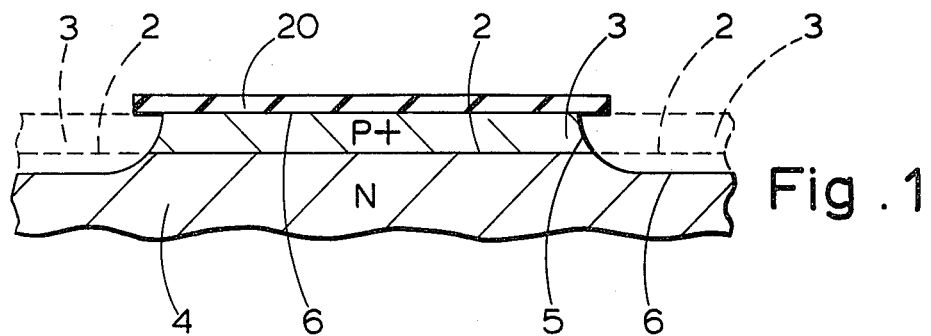
FIGS. 1 and 2 are cross-sectional views of part of a semiconductor device body at different stages of manufacture using a method in accordance with the invention.

It should be noted that FIGS. 1 to 5 are not drawn to scale, and the relative dimensions and proportions of some parts of these FIGS. have been shown exaggerated or reduced for the sake of clarity and convenience. Thus for example the p+ region 3 in the semiconductor body may be $10^4$ times thicker than the oxide layer 10 and $10^2$ times thicker than the semi-insulating layer 7. The horizontal proportions are similarly distorted. The same reference numerals are used in the different Figures to indicate not only the same portions of the same device but also similar portions of different devices.

It should also be noted that FIGS. 1 to 5 show portions of the semiconductor body for one semiconductor device, whereas in practice many semiconductor devices are formed simultaneously in a common semiconductor wafer by effecting the processing steps at each semiconductor device area and then finally dividing the processed wafer into separate bodies for each semiconductor device.

Figure 2:
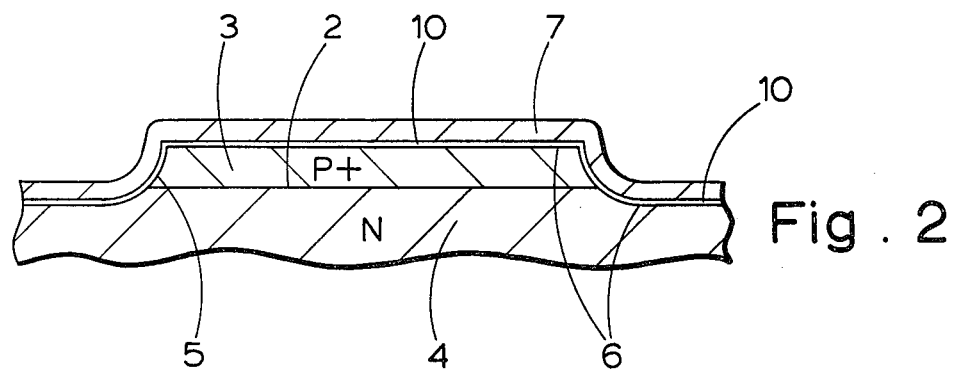
Figure 3:
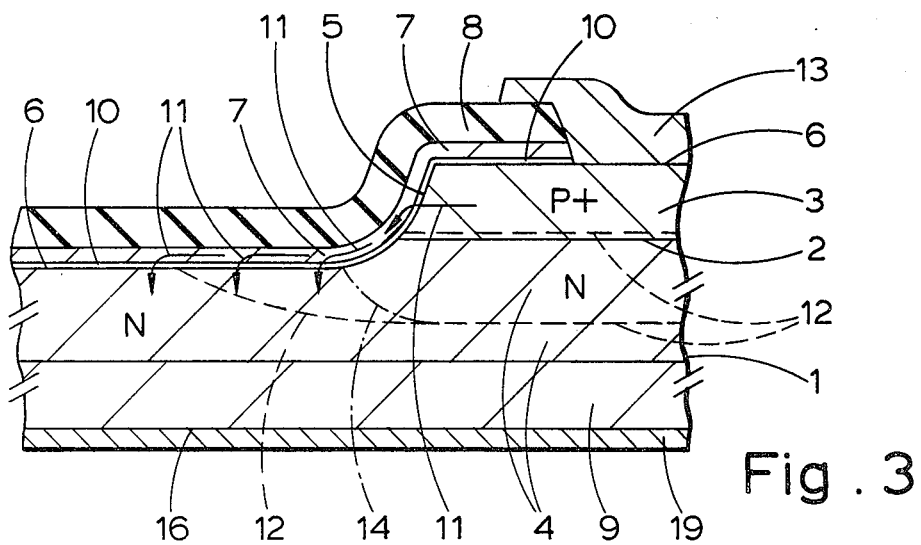
FIG. 3 is a cross-sectional view of an enlarged portion of the body part of FIGS. 1 and 2 showing part of the final device structure manufacture in accordance with the method of the invention.

The embodiment of FIGS. 1 to 3 relates to a mesa-type semiconductor device comprising a monocrystalline silicon semiconductor body 1 (see FIG. 3) having a substantially flat p-n junction 2 which is formed by a p-type region 3 provided in an n-type body portion 4 and which terminates at the side wall 5 of a mesa portion of a nonplanar surface 6 of the body 1. The p-n junction 2 is reverse-biased at least in one mode of operation of the device. As will be discussed in more detail hereinafter, the p-n junction 2 may be, for example, the rectifying junction of a power rectifier diode, or the base-collector junction of a power transistor, or for example one of the blocking junctions of a thyristor.

A passivating layer 7 of semi-insulating material is present on the surface 6 at least where the junction 2 terminates. In this embodiment the layer 7 is covered with an insulating layer 8, for example of glass.

In accordance with the present invention, the semi-insulating layer 7 is present on a layer 10 of insulating material formed at the surface 6 by a chemical conversion treatment at a temperature above room temperature. In this example the layer 10 is a generic oxide layer. This oxide layer 10 has a substantially uniform thickness which is sufficiently small to permit conduction between the semi-insulating layer 7 and the semiconductor body 1 as indicated by arrows 11 but sufficiently large to reduce the conduction so as to increase along the surface 6 the spread of a depletion layer 12 from the junction 2 under reverse-bias. In FIG. 3, the edge of the depletion layer 12 is indicated in broken lines. The chain-dot line 14 indicates the reduced spread of the depletion layer along the surface of the region 4 which would have occurred in the absence of the oxide layer 10.

As shown in the embodiment of FIG. 3, the p-type region 3 is contacted through a window in the layers 7, 8, 10 by an electrode 13 which may be of for example aluminium. The body 1 includes adjacent its opposite major surface 16 a semiconductor region 9 which is metallized to form an electrode 19. In the case of a rectifier diode, the n-type region 4 is typically a high resistivity substrate in which more highly doped p-type and n-type regions 3 and 9 respectively are formed by dopant diffusion, the electrodes 13 and 19 forming the anode and cathode respectively.

In the case of a power transistor the region 4 is typically an epitaxial layer deposited on a highly-doped substrate 9 of the same conductivity type which together form the collector region of the transistor. The opposite conductivity type region 3 then forms the transistor base region having a base electrode 13 so that p-n junction 2 is the collector-base junction. At least one emitter region of the same conductivity type as region 4 is provided locally in the base region 3 (within a part of the mesa portion which is not shown in FIG. 3) and has an emitter electrode (also not shown in FIG. 3). These emitter and base electrodes have separate contact windows in an insulating layer on the top of the mesa portion.

However, as mentioned hereinbefore the p-n junction 2 passivated in accordance with the invention may also be a rectifying junction of a thyristor. In this case the FIG. 3 structure is slightly modified. The region 4 is typically a high resistivity n-type substrate in which more highly doped regions 3 and 9 are formed by diffusion of the same acceptor dopant(s) in the same diffusion step. Thus the regions 3 and 9 are in this case of the same conductivity type (p-type). Except when the thyristor is a triac (which is a bidirectional device), the p-type region 9 with its electrode 19 now constitutes the anode of the thyristor. A cathode formed by an n-type emitter region is provided locally in the p-type base region 3 in a similar manner to the hereinbefore-described emitter region of a power transistor. When the thyristor is a triac an additional n-type emitter region is provided in the p-type region 9 adjacent the surface 16 and is shorted to the region 9 by the electrode 19.

In the case of a thyristor the termination of the p-n junction between the n-type region 4 and the p-type region 9 should also be passivated. This may be effected by mesa-etching the surface 16 of the body 1 so that this p-n junction terminates below passivation at the side wall of the resulting mesa, for example as illustrated in FIGS. 1 or 3 of U.K. Pat. No. GB: 1,294,184 A. Preferably the passivation used for the junction between regions 4 and 9 also comprises an insulating layer on a semi-insulating or a thin oxide with similar properties to those of layers 7, 8 and 10. However, the p-n junction between the regions 4 and 9 may also be terminated below the passivation 7, 8, 10 at the top surface 6 of the thyristor body by using deep diffusion in grooved structures such as those described in, for example, U.K. Pat. GB No 1,536,545 A, GB 1,499,845 A reference and GB 1,314,267 A.

The device of FIG. 3 is manufactured in the following way, starting with a silicon wafer having the n-type region 4 adjacent its upper plane surface. As just described the nature of the region 4 will vary according to the type of device to be manufactured. Acceptor dopant is first diffused from the whole of the upper plane surface of the wafer to form a p-type layer 3 which adjoins the surface and forms a flat p-n junction 2 extending laterally across the whole wafer, see FIG. 1.

An etchant masking layer pattern 20 of, for example, silicon dioxide is then provided on the p-type layer 3 to mask areas where the mesa portions are to be formed. Then using a known etchant solution (for example a mixture of acetic, nitric, and hydrofluoric acids) the exposed silicon at the upper surface of the wafer is etched away over a depth greater than the depth of the p-type layer 3. In this manner the p-type regions restricted to mesa portions are formed and the remaining p-n junction portions terminate at the bare side-walls 5 of the mesa portions. The portions of the original surface and junction which are etched away are indicated by broken lines in FIG. 1.

The non-planar surface 6 formed by this mesa-etching treatment is bare except where covered by the masking layer pattern 20. The layer pattern 20 is then removed for example by etching with hydrofluoric acid. This etching step will also ensure removal of any natural oxide which may have been formed on the bared silicon surface after the mesa-etching step, for example due to conditions under which the mesa-etched wafer may have been stored.

An oxidation treatment at a temperature above room temperature is now performed to controllably grow the generic oxide layer 10 at the bared semiconductor surface 6. An oxidizing clean of the silicon surface 6 may be used for this purpose, for example by immersing the wafer in a bath comprising a cleaning liquid such as a solution containing hydrogen-peroxide or a boiling nitric acid solution. In the case of hydrogen peroxide, suitable conditions are, for example, an exposure time of 15 minutes to a solution of 1 part by volume of hydrogen peroxide and 1 part by volume of concentrated ammonia solution (or hydrochloric acid) in 5 parts by volume of water and at 80° C. In the case of nitric acid, suitable conditions are, for example, an exposure time of 15 minutes to a solution of concentrated nitric acid at 80° C. The resulting oxide layer 10 is of acceptable quality and has a substantially uniform thickness which is estimated to be about 15 Å (0.0015 micron). This very thin oxide layer is sufficiently thin to permit conduction (for example by tunnelling of charge-carriers) between the silicon body 1 and the semi-insulating layer 7 to be provided, but is sufficiently thick to form a barrier which reduces the conduction, thereby encouraging current flow along the layer 7 with the advantages described hereinbefore.

However, instead of using an oxidizing clean, an oxidation treatment may be used which involves subjecting the bared silicon surface 6 to dry oxygen and at a temperature of between 300° C. and 500° C. This may be performed with the silicon wafer mounted either in a reactor which is then to be used for depositing the semi-insulating material or in a separate oxidation furnace. With this low temperature thermal oxidation treatment it is easier to control the oxide growth and so form oxide layers of good quality with reproducible characteristics. Suitable conditions are, for example, an exposure at 350° C. to a gas flow of dry oxygen at atmospheric pressure for 30 minutes. The resulting oxide layer thickness is estimated to be just over 10 Å (0.001 micron).

Immediately after forming and rinsing the oxide layer 10, the semi-insulating material is deposited to form the passivating layer 7, as illustrated in FIG. 2. The material of layer 7 will generally be chosen so as to have a resistivity of between approximately $10^7$ and $10^{10}$ ohm.cm. Various materials may be used, for example a chalcogenide material or oxygen-doped polycrystalline silicon.

Suitable chalcogenide materials for the layer 7 are described in the article by Smeets et al in Journal of Electrochemical Society, Solid-State Science and Technology, September 1977, pages 1458 and 1459. The formation of oxygen-doped polycrystalline silicon is described in for example U.K. Patent Specification GB No. 1496814 A; the oxygen content of such a polycrystalline layer for layer 7 will generally be between 10 and 40 atomic percent, for example approximately 20 atomic percent. In some cases it may even be desirable to use, for example, undoped amorphous or polycrystalline silicon for the layer 7. Polycrystalline silicon (undoped) may have a resistivity of approximately $10^6$ ohm.cm. However an advantage of providing an oxide layer 10 in accordance with the invention is that semi-insulating layers 7 of high resistivity can be used thereby reducing the leakage current while continuing to obtain a wide-spread of the depletion layer.

A thick layer of passivating glass 8 is then formed in known manner on the semi-insulating layer 7 to protect the layer 7 against moisture and other contaminants and so enhance the passivation of the semiconductor surface 6. The wafer is then subjected to further processing, for example to provide contact windows and electrodes, after which it is divided to form the separate bodies 1 for each semiconductor device.

Figure 5:
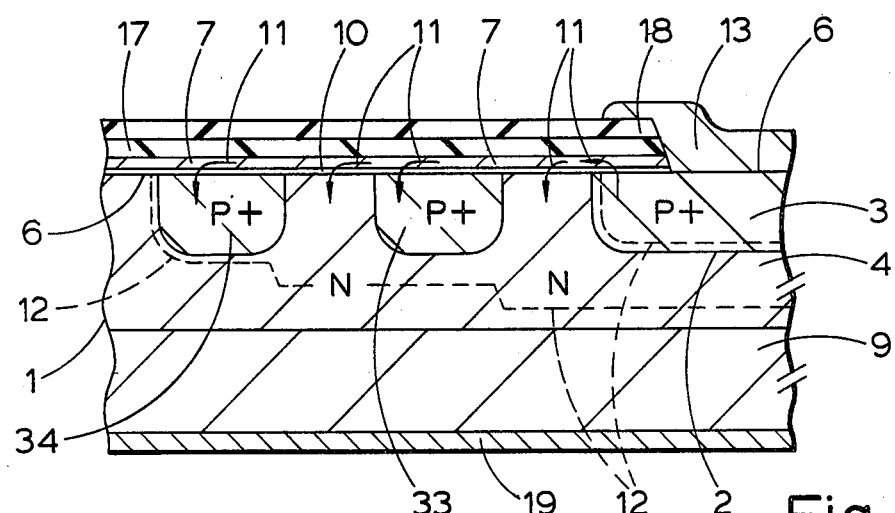
FIG. 5 is a cross-sectional view of an enlarged portion of the body part of FIG. 4 showing part of the final device structure manufacture in accordance with the invention.

It will be evident that many modifications are possible within the scope of this invention. In the modified embodiment of FIG. 5 the semi-insulating layer 7 is covered with a silicon oxide layer 17 and then a silicon nitride layer 18 instead of the glass layer 8. FIG. 5 also illustrates the application of the present invention to a so-called planar device structure in which the device body 1 has a substantially plane surface 6 at which the p-n junction 2 terminates. At and beyond the termination of the junction 2 this surface 6 is passivated by the semi-insulating layer 7 on a thin oxide layer 10 as in the previous embodiment. In this case, the silicon surface 6 is bared not by mesa-etching into the silicon but by removing from the original surface of the wafer insulating and glass layers associated with dopant diffusion.

Figure 4:
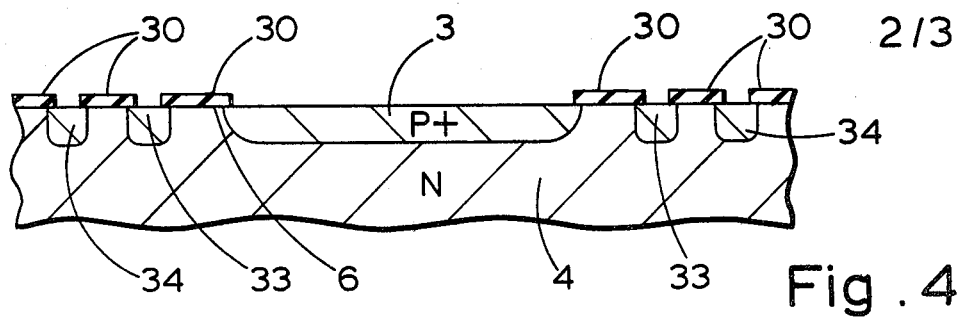
FIG. 4 is a cross-sectional view of part of another semiconductor device body at a stage of manufacture using another method in accordance with the invention.

Thus, as shown in FIG. 4, an insulating layer pattern 30 is provided on the n-type region 4 of the wafer in this embodiment to localize in known manner the diffusion of acceptor dopant(s) into the wafer surface 6 to form the p-type region 3 and surrounding p-type rings 33 and 34. Such rings, which are described in for example United States Patent US 3391287 and the article by Matsushita et al, serve to control the spread of the depletion layer 12. Although not shown in FIG. 4, a glass layer often forms at the windows in layer 30 during the diffusion treatment. After this p-type diffusion to form the p-n junctions the layer 30 and the glass layer are removed by etching in known manner to re-expose the silicon surface 6. The surface 6 can then be oxidized as in the previous embodiment and provided with the further passivation layer 7, 17 and 18.

Instead of using an oxidation treatment the generic layer 10 may be of another insulating material, for example silicon nitride formed by nitriding the silicon surface 6 at an elevated temperature. It will also be evident that the conductivity types of all the regions of the devices of FIGS. 3 and 5 may be reversed.

Figure 6:
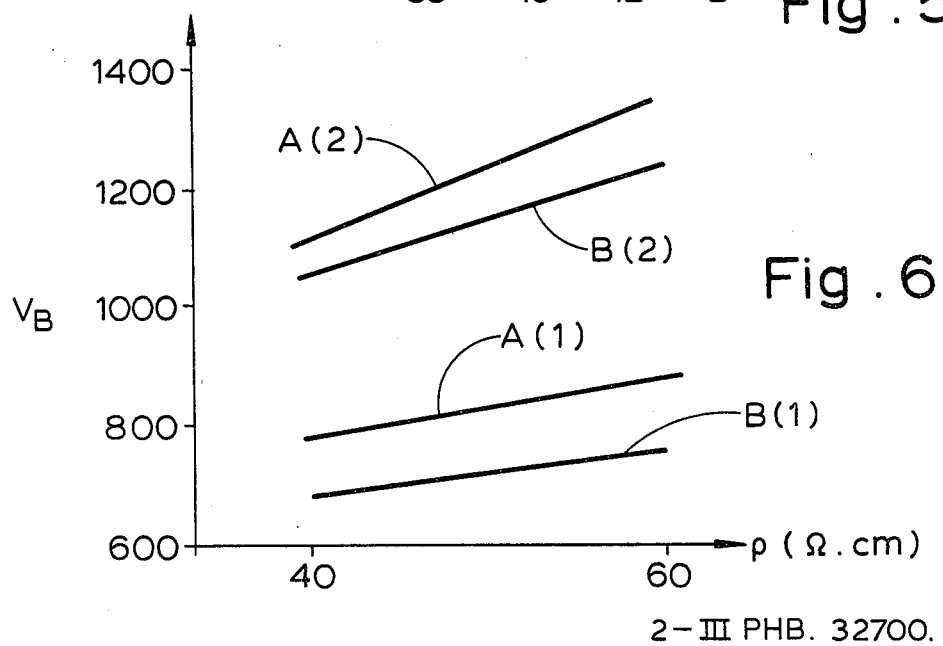
FIG. 6 is a graph of breakdown voltage $V_B$ in volts against semiconductor resistivity $\rho$ in ohm.cm. depicting the effect of performing an oxidizing cleaning treatment in accordance with the invention.

FIG. 6 is a graph illustrating the increase in breakdown voltage $V_B$ (in volts) resulting from the formation of an oxide layer 10 using an oxidizing clean for rectifier diodes having a structure similar to that of FIG. 3. The abscissa of the graph is the resistivity of the n-type region 4 in ohm.cm. The regions 3 and 9 had respective dopant concentrations of approximately $10^{20}$ atoms per $cm^3$ and $10^{21}$ atoms per $cm^3$ at the surface 6 and 16. The approximate thicknesses of the regions 3, 4 and 9 were 45, 105 and 60 microns respectively, while the height of the mesa was about 70 microns. The approximate thicknesses of the glass layer 8 and semi-insulating layer 7 were 20 microns, and 0.5 micron respectively. The lines A(1) and A(2) relate to a semi-insulating layer 7 having a bulk resistivity of about $2 \times 10^8$ ohm.cm. at room temperature, whereas the lines B(1) and B(2) relate to a resistivity of about $10^9$ ohm.cm. for the layer 7. The diodes having breakdown voltages indicated by lines A(1) and B(1) had no oxide layer 10 between the semi-insulating layer 7 and the silicon surface 6; the layer 7 was deposited directly on the bared surface 6 after cleaning in hydrofluoric acid, and therefore these diodes A(1) and B(1) are not in accordance with the invention. The diodes corresponding to lines A(2) and B(2) were in accordance with this invention and included a thin oxide layer at the interface of the layer 7 and surface 6. The oxide layer 10 was formed by exposing the bared surface 6 to an oxidizing cleaning solution as described hereinbefore and was estimated as being about 15 Å (0.0015 micron thick). Thus, as can be seen from FIG. 6 the inclusion of this oxide interface raised the breakdown voltage $V_B$ of the diodes by about 400 volts or more.

Figure 7:
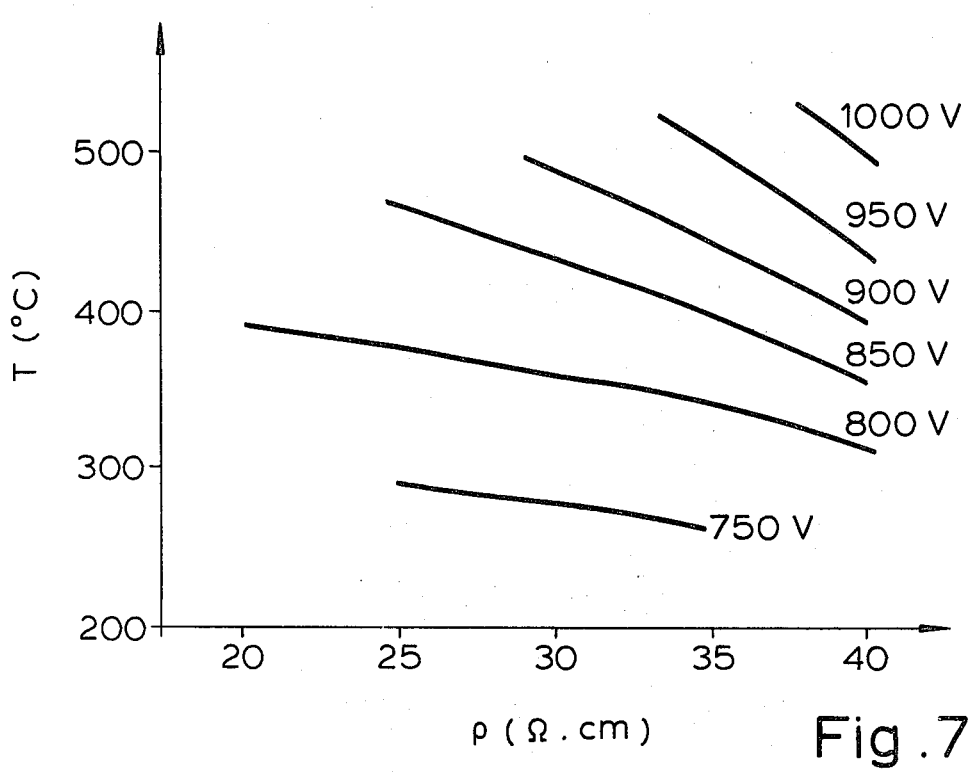
FIG. 7 is a graph of oxidation temperature T in °C. against semiconductor resistivity $\rho$ in ohm.cm. depicting the effect of oxide growth on breakdown voltage.

The graph of FIG. 7 relates to similar rectifier diodes to those of lines A(2) and B(2) of FIG. 6, but in this case the oxide layer 10 was formed by subjecting the bared surface 6 for 30 minutes to dry oxygen and at a temperature which is given by the ordinate of the graph (T in °C.) and which is in the range of about 250° C. to 500° C. Once again the abscissa is the resistivity of the region 4. The different lines (750 V to 1000 V) on the graph represent the breakdown voltage $V_B$ for diodes having different thicknesses of oxide layer 10 as determined by the oxidation temperature T. As can be seen from the graph the breakdown voltage $V_B$ increases with increasing thickness of the oxide layer 10 (increasing oxidation temperature T). However the oxide thickness (and so the oxidation temperature for a given oxidation time) should not be chosen to be so large as to reduce the conduction between the semi-insulating layer 7 and the semiconductor surface 6 to an insignificant level as the advantages of using semi-insulating passivation would be lost and depletion layer 12 may even spread so far as to reach the edge of the body 1. This is particularly important as the resistivity of the layer 7 generally reduces with increase in operating temperature of the device. Thus the thickness of layer 10 should be chosen to maintain a balance between the current flow along the layer 7 and that between the layer 7 and surface 6 so that the depletion 12 does not reach the body edge during operation of the device. A layer 10 produced by oxidation in dry oxygen for 30 minutes at 350° C. is suitable for a device with an n-type base resistivity of 40 ohm.cm. and a junction operating temperature of 150° C.

Figure 8:
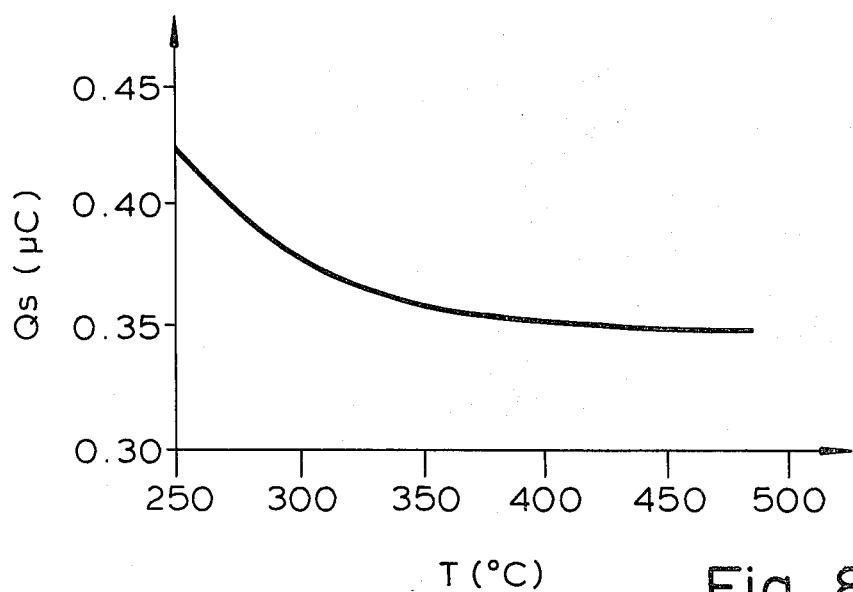
FIG. 8 is a graph of oxidation temperature T in °C. against minority carrier storage $Q_s$ in microCoulomb, depicting the effect of oxide growth on gettering properties.

Such a thickness of oxide layer 10 is also sufficient to significantly reduce gettering by the semi-insulating layer 7 of gold and other lifetime-killer centers which may be provided in the n-type base region 4 to reduce minority carrier storage effects. FIG. 8 is a graph in which the minority carrier storage $Q_s$ in microCoulombs is plotted against the same oxidation T in °C. for such a device containing gold. The magnitude of $Q_s$ is a measure of the charge collected from the region 4 when the forward-biased junction 2 is suddenly reverse-biased and is obtained in a manner known to those skilled in the art. The curve shown in FIG. 8 represents the results obtained when a subsequent heat-treatment (for example at a temperature of 760° C.) is performed which can result in the semi-insulating material of layer 7 gettering some of the lifetime-killer centers in region 4. This subsequent heat-treatment may be for example a firing temperature for the glass layer 8. It will be seen from FIG. 8, that for the particular devices measured the amount of minority charge stored in the region 4 increases when the thickness of the oxide layer 10 decreases from that corresponding to an oxidation temperature T of 350° C. Thus the layer 10 appears to be acting as a barrier for gettering of killer centers by the layer 7, especially when the layer 10 was formed with a thickness corresponding to an oxidation temperature of 350° C. or higher.

What is claimed is:

1. A method of manufacturing a semiconductor device being reversely biased in at least one operating condition comprising the steps of
   terminating a p-n junction at a surface of a semiconductor body,
   baring said surface at said p-n junction of all naturally formed insulating layers,
   subjecting said bared surface to a conversion treatment at a temperature above room temperature, said conversion treatment converting said semiconductor body into a thin layer of insulating material having a thickness of less than 100 A (0.01 micron) which is small enough to enable conduction between said semiconductor body and a passivating layer to be formed thereon and large enough to keep said conduction so low that the width of the depletion layer associated with a reversely-biased p-n junction increases along said surface, and
   forming a passivating layer of semi-insulating material on said layer of insulating material.

2. A method according to claim 1, wherein said layer of insulating material is at least 10 A (0.001 microns) thick.

3. A method according to one of claims 1 or 2, wherein said conversion treatment includes an oxidation treatment for oxidizing said bared semiconductor surface to form an oxide layer as said layer of insulating material.

4. A method according to claim 3, wherein said oxidation treatment includes subjecting said bared semiconductor surface to dry oxygen at a temperature of between 300° C. to 500° C.

5. A method according to claim 3, wherein said step of baring said semiconductor surface includes exposing said surface to a liquid for forming said oxide layer.

6. A method according to claim 5, wherein said liquid includes one of nitric acid or a solution containing hydrogen peroxide.

7. A method according to one of claims 1 or 2, wherein said layer of insulating material is silicon nitride, formed by nitriding said bared surface of silicon.

8. A method according to one of claims 1 or 2, wherein said passivating layer is one of a chalogenide material, an undoped amorphous or polycrystalline silicon layer, or an oxygen-doped polycrystalline silicon layer.

9. A method according to one of claims 1 or 8, wherein said passivating layer has a resistivity of between $10^6$ to $10^{10}$ ohm. cm.

* * * * *